United States Patent
Contini et al.

(10) Patent No.: US 12,038,780 B1
(45) Date of Patent: Jul. 16, 2024

(54) PHASE MISMATCH DETECTION FOR A MULTIPHASE SYSTEM

(71) Applicant: Synopsys, Inc., Mountain View, CA (US)

(72) Inventors: Edoardo Contini, Milan (IT); Giacomino Bollati, Castel San Giovanni (IT); Alberto Minuti, Milan (IT); Choon Haw Leong, Portland, OR (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/172,185

(22) Filed: Feb. 21, 2023

(51) Int. Cl.
| | |
|---|---|
| *G06F 1/08* | (2006.01) |
| *G04F 10/00* | (2006.01) |
| *H03K 5/01* | (2006.01) |
| *H03K 17/687* | (2006.01) |
| *H03K 5/00* | (2006.01) |

(52) U.S. Cl.
CPC .............. *G06F 1/08* (2013.01); *G04F 10/005* (2013.01); *H03K 5/01* (2013.01); *H03K 17/6872* (2013.01); *H03K 2005/00286* (2013.01)

(58) Field of Classification Search
CPC .......................................................... G06F 1/08
USPC .......................................................... 327/237
See application file for complete search history.

(56) References Cited

U.S. PATENT DOCUMENTS

| | | | | |
|---|---|---|---|---|
| 8,487,795 | B1* | 7/2013 | Jiang | G11C 27/024 327/434 |
| 2023/0163768 | A1* | 5/2023 | Lee | H03L 7/0992 375/376 |
| 2024/0014742 | A1* | 1/2024 | Xu | H02M 3/33576 |

* cited by examiner

*Primary Examiner* — Tomi Skibinski
(74) *Attorney, Agent, or Firm* — Lowenstein Sandler LLP

(57) ABSTRACT

A processing device identifies clock phases of a multiphase clock system. The processing device selects a first clock phase and a second clock phase of the clock phases. The processing device determines an aggregate phase distance between the first clock phase and the second clock phase over multiple clock periods. The processing device determines, based on the aggregate phase distance, an aggregate time duration between the first clock phase and the second clock phase over the multiple clock periods of the multiphase clock system.

20 Claims, 7 Drawing Sheets

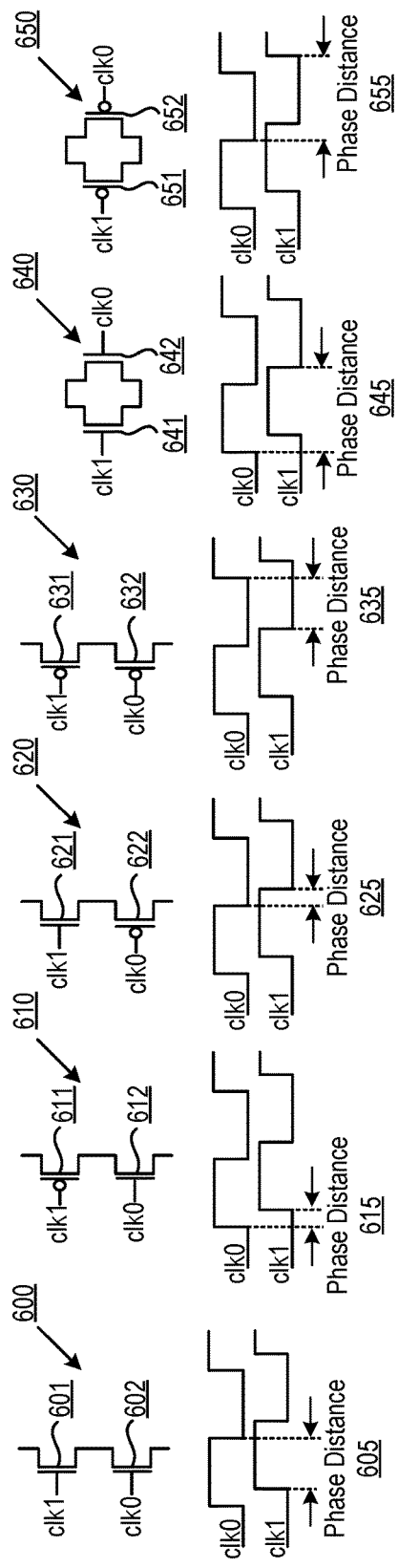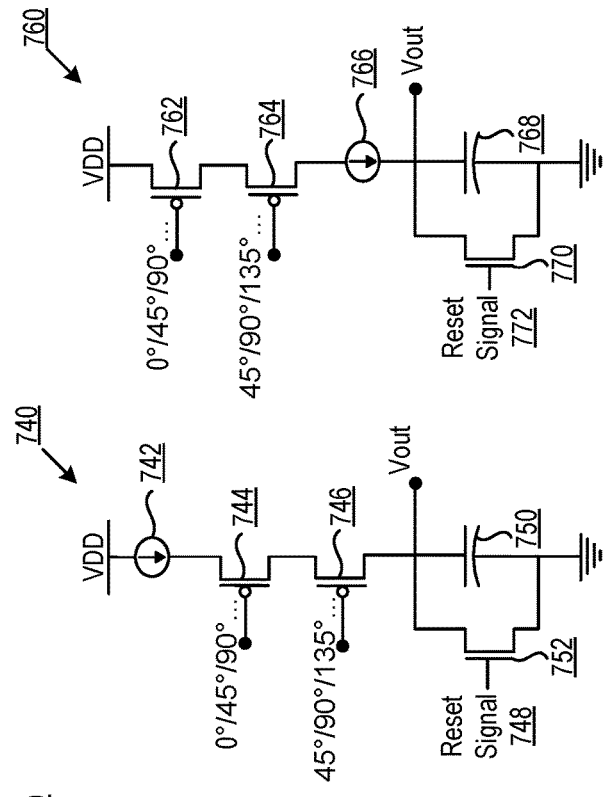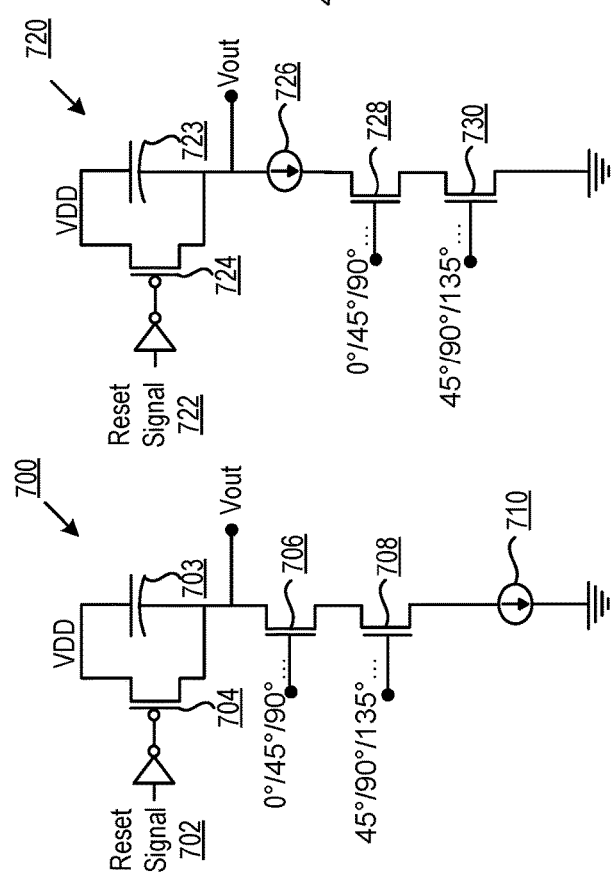

PHASE MISMATCH DETECTION FOR A MULTIPHASE SYSTEM

TECHNICAL FIELD

The present disclosure relates to the field of multiphase clock systems and, in particular, to phase mismatch detection for a multiphase system.

BACKGROUND

A multiphase clock system may utilize a multiphase clock generator to generate a set of clock phases that each have the same frequency but different phases. Process variation and systematic imbalances in circuit elements of the multiphase system may lead to nonuniform phase spacing between clock phases generated by the multiphase clock generator.

SUMMARY

A processing device identifies multiple clock phases of a multiphase clock system. The processing device selects a first clock phase a second clock phases of the multiple clock phases and determines an aggregate phase distance between the first clock phase and the second clock phase over multiple clock periods of the multiphase clock system. In some embodiments, the processing device selects the first clock phase and the second clock phase using a multiplexer (MUX). The processing device determines an aggregate phase distance between the first clock phase and the second clock phase over the multiple clock periods of the multiphase clock system. In some embodiments, the processing device identifies a target time duration between the first clock phase and the second clock phase and compares the aggregate time duration between the first clock phase and the second clock phase to the target time duration between the first clock phase and the second clock phase to determine a phase mismatch between the first clock phase and the second clock phase.

In some embodiments, the first clock phase and the second clock phase are adjacent clock phases of the multiple clock phases of the multiphase clock system. In some embodiments, to determine the target time duration between the first clock phase and the second clock phase, the processing device determines an average time duration between adjacent clock phases of the multiphase system.

In some embodiments, to determine the phase distance between the first clock phase and the second clock phase over the multiple clock periods, the processing device activates a reset transistor coupled to a charge integrator capacitor to discharge the charge integrator capacitor. The processing device deactivates the reset transistor to indicate a beginning of a detection interval and to begin charging the charge integrator capacitor using a current source. The processing device further implements a current gate over the current source that allows the current source to charge the charge integrator capacitor while the first clock phase and the second clock phase are at a logic high signal. Responsive to the charge integrator capacitor falling below a threshold voltage, the processing device ends the detection interval. In some embodiments, the current gate includes a first transistor couple to the first clock phase and a second transistor couple to the second clock phase.

In some embodiments, to determine, based on the phase distance, an aggregate time duration between the first clock phase and the second clock phase over the multiple clock periods, the processing device, responsive to deactivating the reset transistor, begins incrementing a count of a counter circuit. Responsive to the charge integrator capacitor falling below the threshold voltage, the processing device ceases to increment the count of the counter circuit. The count of the counter circuit when the charge integrator capacitor falls below the threshold voltage corresponds to the aggregate time duration between the first clock phase and the second clock phase over the multiple clock periods.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 6A through FIG. 6F illustrate alternative circuit diagrams of a current gate, in accordance with some embodiments of the present disclosure.

FIG. 7A through FIG. 7D illustrate alternative circuit diagrams of a time-to-time converter, in accordance with some embodiments of the present disclosure.

DETAILED DESCRIPTION

Figure 1:
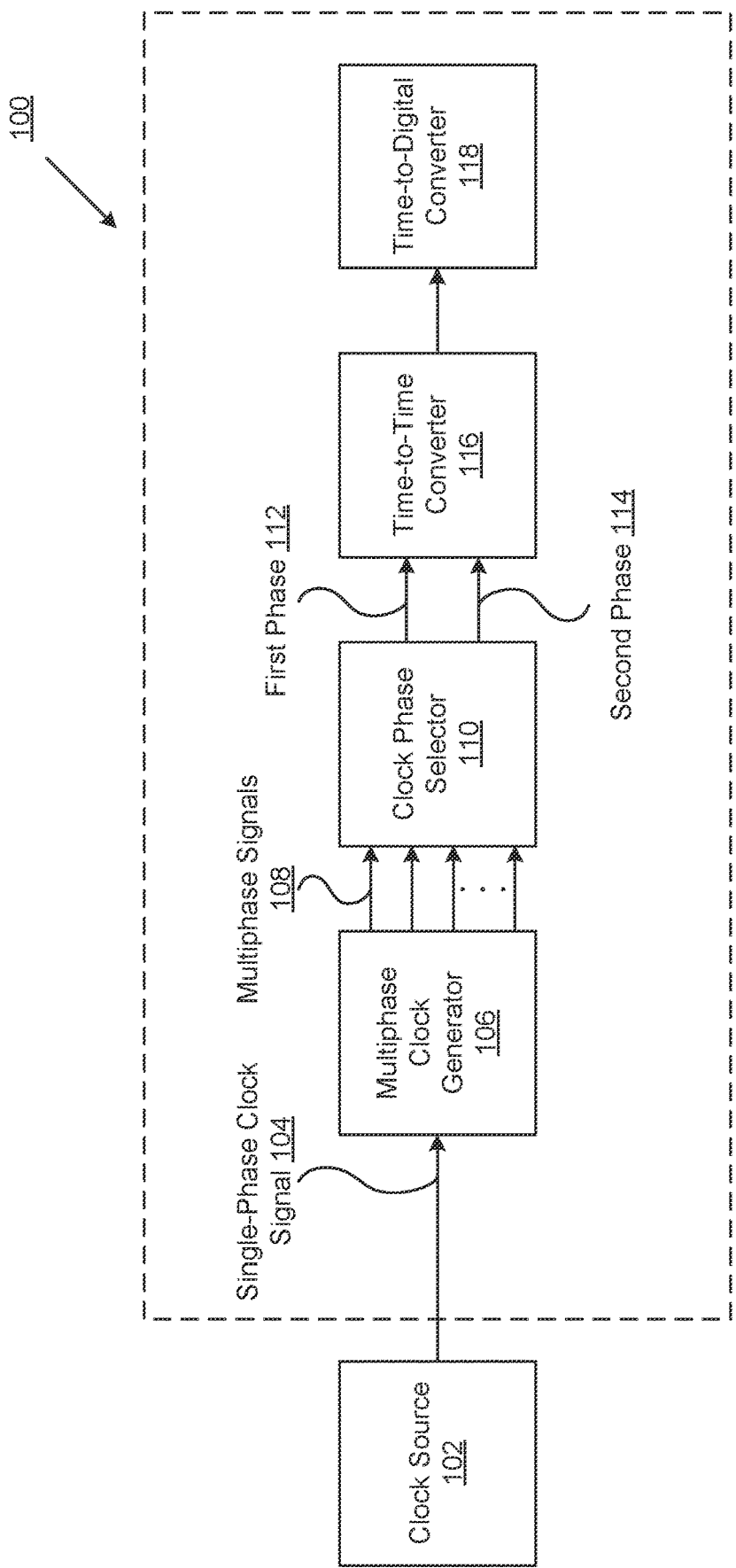
FIG. 1 is a block diagram of an integrated circuit with a multiphase clock generator, a clock phase selector, a time-to-time converter, and a time-to-digital converter, in accordance with some embodiments of the present disclosure.

Communications systems transmit and receive signals at a high data rate (e.g., up to 200 gigabits/second (Gbits/sec)). High-speed data transmissions between, for example, computing and storage devices is often achieved with a Serializer/Deserializer (SERDES) system. Multi-phase clock generation is an important feature in high-speed SERDES systems. Multiphase clock generators (e.g., phase rotators, phase-locked loops, delay-locked loops, ring oscillators, etc.) are used to in high speed input/output (I/O) circuits such as SERDES to generate multiphase clock signals. SERDES systems may utilize multiphase clock signals to achieve high throughput. SERDES systems used in wireless communications, data communications, and computing systems utilize precise clocking and uniformity between clock phases to operate at high speeds and achieve high throughput. Uniformity between clock phases is achieved when a first edge of each clock phase is evenly spaced from the first clock edge of respective adjacent clock phases (e.g., preceding or proceeding clock phases). However, multiphase clock generators may generate a set of clock phases that have a degree of phase mismatch between clock phases of the set of clock phases. Phase mismatch is nonuniformity between the clock phases and can impact the speed, accuracy, and throughput of the system. Further, phase mismatch induces timing errors that constrain high-speed synchronization circuits.

Certain factors that contribute to phase mismatch include process variation, temperature variation, voltage variation, and other factors. Process variation may occur in semiconductor devices during fabrication, and includes variation in attributes (e.g., length, widths, oxide thickness) of transistors when integrated circuits (IC) are fabricated. For example, resistors of an IC design may have the same resistance according to the IC design, but improper etching during fabrication may cause slight variation in the area of the resistors such that the resistors do not have the exact same resistance. Process variation may cause phase mismatch in a multiphase clock generator, degrading performance. Due to process variation of circuit elements introduced during fabrication, temperature variation, and voltage variation, some systems may perform complex calibration at the time of fabrication to correct a resulting phase mismatch. Calibration at the time of fabrication is increasingly difficult as the size of transistors is reduced in advanced processes. Additionally, as the speed of SERDES systems increases, phase mismatch is increasingly difficult to detect. For example, multiphase clock generators in high-speed systems may generate a set of clock phases with less than 100 femtoseconds of phase mismatch between clock phases. Certain systems may attempt to prevent phase mismatch at such a degree of accuracy by calibrating the multiphase system at the time of fabrication. While such calibration can reduce phase mismatch and shift clock phases, correction of phase mismatch to such a degree of accuracy can become difficult and costly.

Aspects and embodiments of the present disclosure address the above and other deficiencies by providing a system and method for detecting phase mismatch of a multiphase system. Aspects and embodiments of the present disclosure can provide an integrated circuit (e.g., also referred to as a phase detection circuit herein) capable of detecting phase mismatch in a multiphase system that generates (e.g., via a phase rotator, phase-locked loops, delay-locked loops, ring oscillators, etc.) multiphase signals (also referred to as "clock phases" herein). The phase detection circuit can detect phase mismatch to a high degree of accuracy (e.g., within 10's of femtoseconds) by aggregating a phase distance between a first clock phase and a second clock phase of the multiphase system over multiple clock periods. The phase distance is the amount of separation between a first clock edge of the first clock phase and a first clock edge of the second clock phase.

In some embodiments, the integrated circuit (IC) includes a time-to-time converter that aggregates the phase distance between the first clock phase and the second clock phase based on a charge integrator capacitor. Prior to a detection interval of an aggregate phase distance between the first clock phase and the second clock phase, a reset transistor coupled to the charge integrator capacitor is activated and the charge integrator capacitor is discharged, bringing the output voltage of the IC up to a voltage of a main power supply of the IC. The reset transistor is deactivated, indicating the beginning of the detection interval, and allowing a current source to begin charging the charge integrator capacitor. The time-to-time converter is coupled to two transistors that implement a current gate over the current source. The current gate is configured to allow current to flow from the current source and through the current gate to charge the charge integrator capacitor during an interval corresponding to the phase distance between the first clock phase and the second clock phase. Accordingly, the rate of change of voltage (VOUT) of an output node of the charge integrator capacitor may be modeled according to the phase distance between the first clock phase and the second clock phase, as described in detail below. The output node of the charge integrator capacitor may be coupled to a comparator that is configured to trigger when the charge integrator capacitor voltage falls below a threshold voltage, ending the detection interval.

The IC circuit may include a time-to-digital converter that aggregates a time duration between the first clock phase and the second clock phase based on the time-to-time converter. In some embodiments, the time-to-time converter includes a counter circuit that begins incrementing a count at the beginning of a detection interval (e.g., responsive to the time-to-time converter deactivating a reset transistor associated with the charge integrator capacitor). The circuit ceases incrementing the count at the end of the detection interval (e.g., responsive to the charge integrator capacitor falling below a threshold voltage and the comparator circuit being triggered). The aggregate time duration is represented by the count of the counter circuit after the comparator triggers.

In some embodiments, the aggregate time duration can be compared to a target time duration (e.g., the time duration between a first clock phase a second clock phase with no phase mismatch) to determine a phase mismatch between the first phase and the second phase. Processing logic may adjust (e.g., via a delay line) the multiphase clock generator according to the detected phase mismatch between the first clock phase and second clock phase.

Technical advantages of the present disclosure include reducing phase-mismatch in a multiphase system, improving the multiphase system's overall energy efficiency and latency, and allowing the multiphase system to increase an overall frequency, thereby improving performance.

FIG. 1 is block diagram of an implementation of a system configuration, in accordance with some embodiments of the present disclosure. Illustrated is a multiphase system 100 including a clock source 102, a multiphase clock generator 106, a clock phase selector 110 (also referred to as "phase selection circuit 110" herein), a time-to-time converter 116 (also referred to as "time-to-time converter circuit 116" herein), and a time-to-digital converter 118 (also referred to as "time-to-digital converter circuit 118" herein). The clock source 102 is coupled to the multiphase clock generator 106. The multiphase clock generator 106 receives a single-phase clock signal 104 from the clock source 102.

The multiphase clock generator 106 generates a set of multiphase signals 108 using the single-phase clock signal 104. In some embodiments, multiphase clock generator 106 may be a phase rotator, delay-locked loop, a phase-locked loop, or a ring oscillator, etc. In some embodiments, the phases of the set of multiphase signals 108 may be uniform. That is, a first edge (e.g., a rising edge) of each phase signal is evenly distributed from one another. For example, FIG. 2 illustrates eight uniform phase signals in the set of multiphase clock signals.

Figure 2:
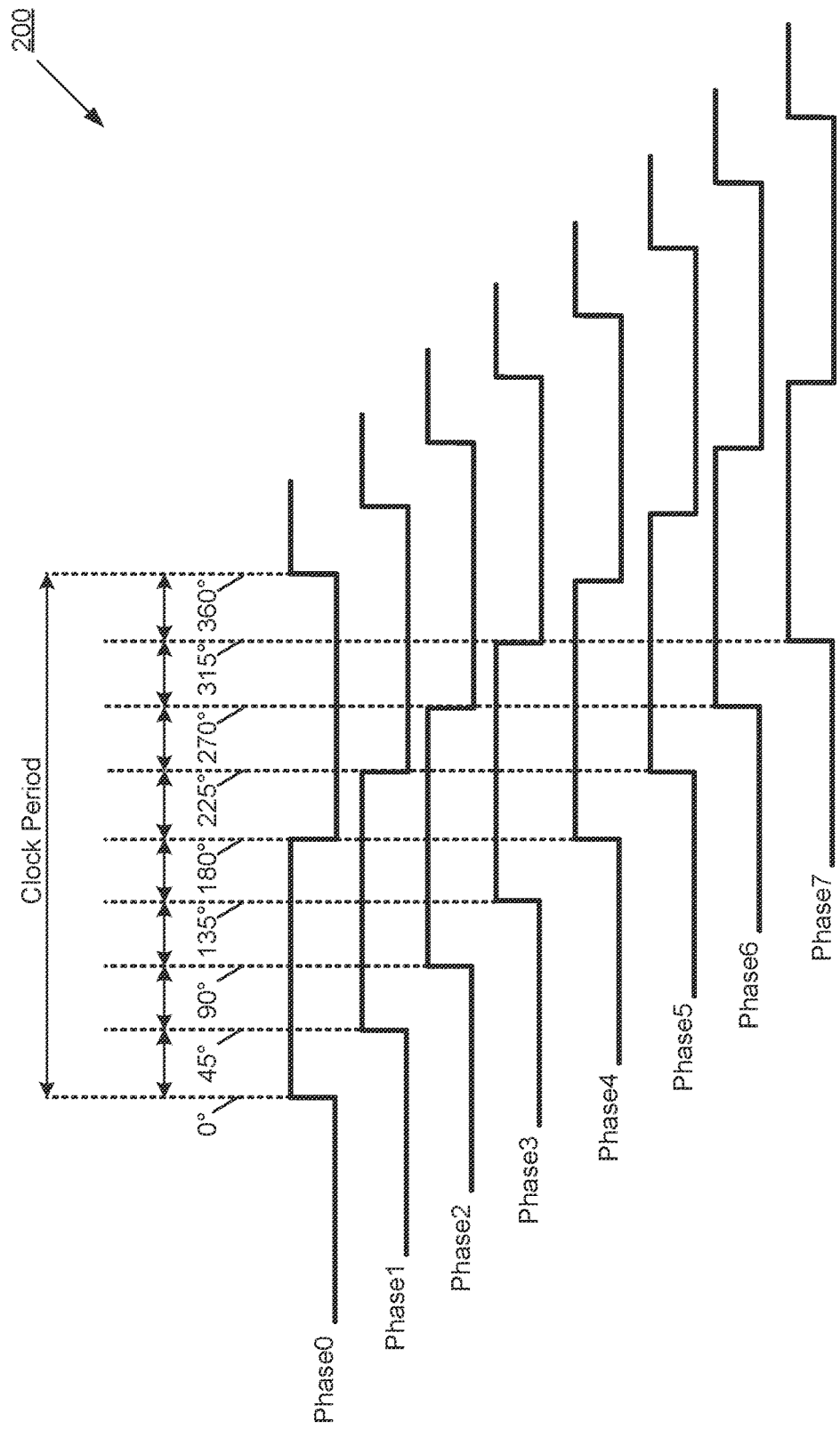
FIG. 2 is a clock phase diagram of phase signals of the multiphase clock generator of FIG. 1 with eight uniform phases, in accordance with some embodiments of the present disclosure.

FIG. 2 is a clock phase diagram 200 of phase signals of the multiphase clock generator 106 of FIG. 1 with eight uniform phases, in accordance with some embodiments of the present disclosure. As illustrated with respect to FIG. 2, each first edge (e.g., rising edge) of the eight phase signals are evenly spaced, the rising edge of phase0 is at 0 degrees, the rising edge of phase1 is at 45 degrees, the rising edge of phase2 is at 90 degrees, the rising edge of phase3 is at 135 degrees, the rising edge of phase4 is at 180 degrees, the rising edge of phase5 is at 225 degrees, the rising edge of phase6 is at 270 degrees, and the rising edge of phase7 is at 315 degrees. Accordingly, the sum of phase0 through phase7 is equivalent to 360 degrees and 360 degrees is equivalent to the clock period. It can be noted that, in some embodiments, the multiphase clock generator 106 may generate a set of phase signals that are not uniform, as described above. For example, the rising edge of phase0 may be at 0 degrees, the rising edge of phase1 may be at 43 degrees, the rising edge of phase2 may be at 94 degrees, the rising edge of phase3 may be at 130 degrees, the rising edge of phase4 may be at 181 degrees, the rising edge of phase5 may be at 223 degrees, the rising edge of phase 6 may be at 266 degrees, and the rising edge of phase 7 may be at 317 degrees (not illustrated). Accordingly, the multiphase clock generator 106 may generate a set of mismatched phase signals. However, the sum of phase0 through phase 7 is still equivalent to 360 degrees and, therefore, the clock period itself. It can be noted that aspects and implementations of the present disclosure may be applied to any number (e.g., 2, 3, 4, 5, 6, 7, 8 . . . N) of phases. However, operations described with respect to multiple clock phases of a multiphase clock generator are described with respect to eight clock phases by way of illustration, and not by way of limitation.

Referring back to FIG. 1, multiphase clock generator 106 is coupled to a clock phase selector 110. The clock phase selector receives a set of multiphase signals 108 from the multiphase clock generator 106. The clock phase selector 110 selects a first phase 112 and a second phase 114 from the set of multiphase signals 108. In some embodiments, the clock phase selector 110 selects adjacent phases from the set of multiphase signals 108. Adjacent phases are phases in a multiphase system that immediately proceed or precede each other. The first phase 112 and the second phase 114 are adjacent phases because the first phase 112 immediate precedes the second phase 114 and the first phase 112 immediately proceeds the second phase 114. For example, the clock phase selector 110 may select phase0 and phase1 of clock phase diagram 200 of FIG. 2. In another example, the clock phase selector 110 may select phase1 and phase2 of clock phase diagram 200 of FIG. 2. In some embodiments, clock phase selector 110 is one or more multiplexers (MUX). For example, clock selector 110 may include a first eight to one MUX and a second eight to one MUX. The first eight to one MUX may receive eight input signals (e.g., eight clock phases) and produce one output signal (e.g., a first phase 112). The second eight to one MUX may receive eight input signals (e.g., eight clock phases) and produce one output signal (e.g., a second phase 114).

The clock phase selector 110 is coupled to a time-to-time converter 116. The time-to-time converter 116 receives a first phase 112 and a second phase 114 from clock phase selector 110. The time-to-time converter 116 is a phase distance detection circuit configured to detect a phase distance between two phases of the multiphase system. For example, the time-to-time converter 116 may detect the phase distance between the first phase 112 and the second phase 114. The phase distance is the amount of separation (e.g., a time length) between a clock edge of the first phase 204 and a clock edge of the second phase 206. It can be noted that the phase distance may be derived from separation between any clock edges of the first phase 204 and the second phase 206, as expressed in the following equations, where N equals the first clock phase:

$$\text{Phase distance=rising edge of phase}[N]-\text{rising edge of phase}[N+1] \quad (1)$$

$$\text{Phase distance=rising edge phase of phase}[N]-\text{falling edge of phase}[N+1] \quad (2)$$

$$\text{Phase distance=falling edge of phase}[N]-\text{rising edge of phase}[N+1] \quad (3)$$

$$\text{Phase distance=falling edge of phase}[N]-\text{falling edge of phase}[N+1] \quad (4)$$

$$\text{Phase distance=rising edge of phase}[N+1]-\text{rising edge of phase}[N] \quad (5)$$

$$\text{Phase distance=rising edge of phase}[N+1]-\text{falling edge of phase}[N] \quad (6)$$

$$\text{Phase distance=falling edge of phase}[N+1]-\text{rising edge of phase}[N] \quad (7)$$

$$\text{Phase distance=falling edge of phase}[N+1]-\text{falling edge of phase}[N] \quad (8)$$

Phase distance may be the separation between any two clock edges of adjacent phases, as expressed by the above equations. However, operations described with respect to the phase distance are described to be implemented as expressed in equation (1) by way of illustration, and not by way of limitation. In some embodiments, time-to-time converter 116 may be configured to detect an aggregate phase distance between the first phase 112 and the second phase 114 over multiple clock periods based on a charge integrator. The time-to-time converter 116 begins a detection interval based on the charge integrator and ends the detection interval after multiple clock periods based on the charge integrator, as described below with respect to FIG. 3.

The time-to-time converter 116 is coupled to a time-to-digital converter 118. The time-to-digital converter 118 includes a counter circuit configured to determine an aggregate time duration between the first phase 112 and the second phase 114. The time-to-digital converter 118 increments the count of the counter circuit every clock period during the detection interval of time-to-time converter 116. The time-to-digital converter stops incrementing the count of the counter circuit at the end of the detection interval. The count of the counter circuit at the end of the detection interval is an aggregate time duration that represents the accumulated phase distance between the first phase 112 and the second phase 114 over multiple clock periods. Because the detection interval occurs over multiple clock periods, any phase distance error the time-to-time converter 116 detects is amplified by the time-to-digital converter 118. In some embodiments, the aggregate time duration may be stored in a memory (not illustrated) for later retrieval and analysis. The aggregate time duration may be compared to a target time duration to determine a phase mismatch between the first clock phase and second clock phase, as described in detail below. Further implementation details regarding the time-to-digital converter 118 are described below with respect to FIG. 4.

In some embodiments, the multiphase clock generator 106, clock phase selector 110, and time-to-digital converter 118 may be integrated in a digital synthesis flow. In some embodiments, the multiphase clock generator 106 does not require a 50% duty cycle out of the set of multiphase signals 108. For example, the multiphase clock generator 106 may produce phase signal that do not have a 50% duty cycle. It can be noted that a nominal duty cycle at the output may fluctuate if the duty cycle of the single-phase clock signal 104 differs from 50%.

Figure 3:
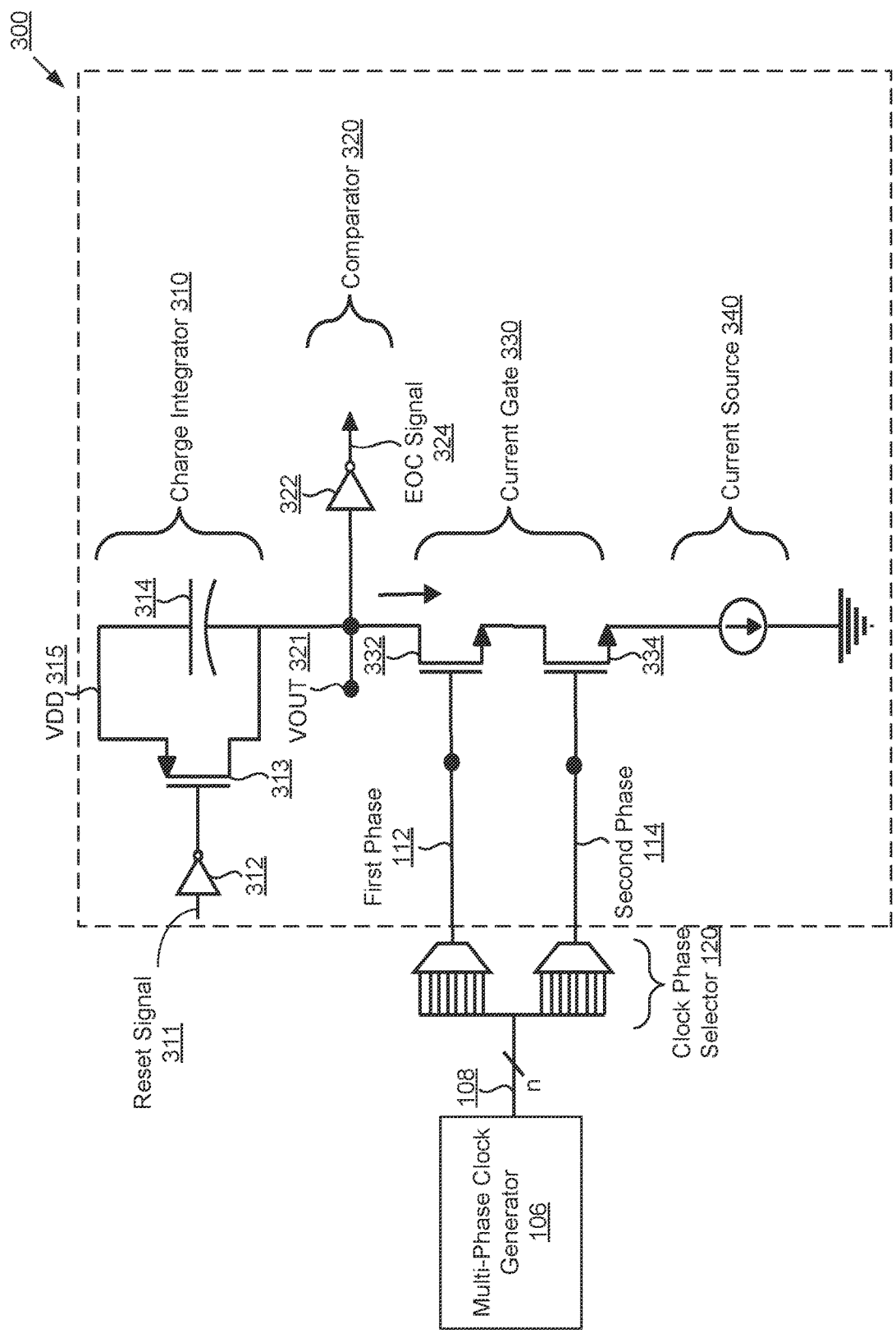
FIG. 3 is a circuit diagram of a time-to-time converter coupled to a clock phase selector, in accordance with some embodiments of the present disclosure.

FIG. 3 is a circuit diagram of a time-to-time converter 300 (also referred to as time-to-time converter circuit 300 herein) coupled to a clock phase selector 120 (also referred to as clock phase selector circuit 120 herein), and a multiphase clock generator 106, in accordance with some embodiments of the present disclosure. Illustrated is a time-to-time converter 300 including a charge integrator 310, coupled to a comparator 320 and a current gate 330. The current gate 330 is in turn coupled to a clock phase selector 120. The clock phase selector 120 is in turn coupled to a multiphase clock generator 106, as described with respect to FIG. 1. The clock phase selector 120 is a circuit configured to receive a set of multiphase signals 108 from multiphase clock generator 106 and select a first phase 112 and a second phase 114 from the set of multiphase signals 108, as described with respect to FIG. 1. The current gate 330 is configured to receive the first phase 112 and the second phase 114 from the clock phase selector 120.

In some embodiments, current gate 330 functions as a logic gate, such as an AND gate, which receives, as inputs, a first phase 112 and a second phase 114 from the clock phase selector 120. The current gate 330 may implement logic gate functionality over the current source 340. In some embodiments, the current gate 330 may allow current to pass through a current source 340, the current gate 330, and a charge integrator 310 for a portion of a clock period. For example, the current gate 330 may allow a gated current (referred to herein as "Igated") to pass through the current gate when the first phase 112 is at a logic high signal and when the second phase 114 is at a logic high signal, such that the current gate 330 turns on. Accordingly, Igated is a current pulse with a pulse width that corresponds to a phase distance between the first phase and the second phase, as illustrated with respect to FIG. 5A.

Figure 5A:
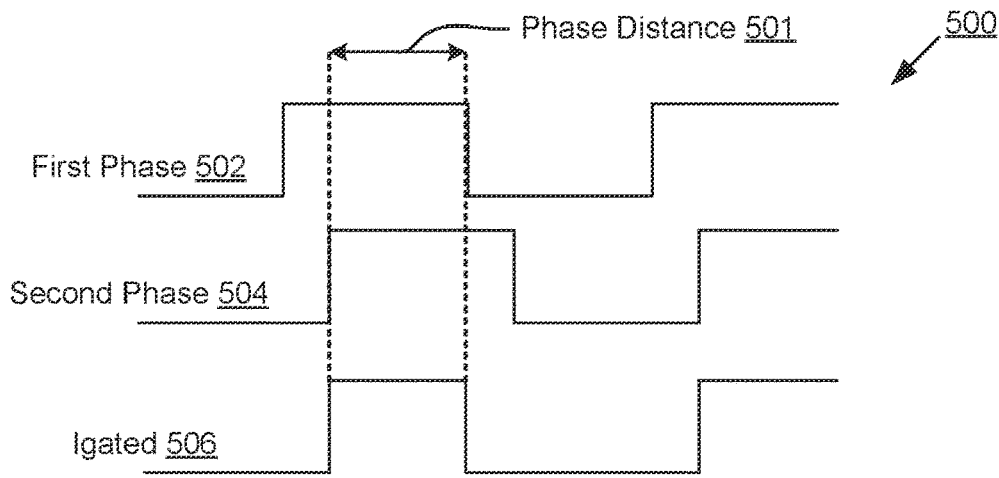
FIG. 5A is a timing diagram of signals of the time-to-time converter of FIG. 3 and the time-to-digital converter of FIG. 4, in accordance with some embodiments of the present disclosure.

FIG. 5A is a timing diagram 500 illustrating measuring a phase distance between a falling edge of a first clock phase and a rising edge of a second phase clock, in accordance with some embodiments of the present disclosure. The first phase 502 and the second phase 504 are two adjacent phases of eight phases in a multiphase system. As illustrated with respect to FIG. 5A, phase distance 501 is the distance between a falling edge of the first phase and a rising edge of the second phase. Igated 506 is a current pulse with a pulse width that corresponds to phase distance 501. In some embodiments, because the multiphase system includes eight phases, adjacent phases of the eight phases will be separated by $\frac{1}{8}^{th}$ of a clock period. Because each of the eight phases have a 50% duty cycle, each of the eight phases are at a logic high signal for $\frac{4}{8}^{th}$ of a clock period and at a logic low signal for $\frac{4}{8}^{th}$ of the clock period. Accordingly, the first phase 502 and the second phase 504 are both at a logic high signal for $\frac{3}{8}^{th}$ of the clock period. Similarly, the phase distance 501 and Igated are equivalent to $\frac{3}{8}^{th}$ of the clock period, as illustrated with respect to FIG. 5A.

Returning to FIG. 3, in some embodiments, current gate 330 may be a combination of transistors to implement logic gate functionality. For example, current gate 330 may include a first N-channel metal-oxide semiconductor (NMOS) 332 which receives, as input, the first phase 112. Current gate 330 may additionally include a second NMOS 334 which receives, as input, the second phase 114. Current source 340 may be coupled to the source terminal of first NMOS 332 and second NMOS 334 such that the current gate 330 implements an AND gate over current generated by current source 340.

Time-to-time converter 300 includes a charge integrator 310. Charge integrator 310 receives pulses of current (Igated) from current source 340 through current gate 330. Charge integrator 310 is a circuit configured to detect a phase distance between first phase 112 and second phase 114. Charge integrator 310 detects the phase distance between the first phase 112 and the second phase 114 by aggregating the phase distance between the first phase and the second phase over multiple clock periods based on Igated. Charge integrator 310 includes a reset transistor 313 coupled between an inverter 312 and a charge integrator capacitor 314.

In some embodiments, the reset transistor 313 may be a p-channel metal-oxide semiconductor (PMOS). In some embodiments, the reset transistor 313 (also referred to as reset PMOS 313 herein) may be a pull-up PMOS. Accordingly, responsive to being activated (e.g., via reset signal 311), reset PMOS 313 may pull an output voltage (e.g., VOUT 321) up to a source voltage (e.g., VDD 315). VDD 315 denotes voltage of a main power supply distribution network that powers circuitry (e.g., time-to-time converter 300) described herein. It can be noted that VDD is merely one example of the power supply name and may vary depending on the implementation. The reset PMOS is coupled to receive a reset signal 311 through an inverter 312. When a reset signal 311 to the charge integrator 310 is high, the inverter 312 inverts the reset signal 311 such that the output of the inverter 312 is a logic low signal. When a logic low signal is applied to the reset PMOS 313, the reset PMOS 313 is activated and VOUT 321 is pulled up to VDD 315. Because the charge integrator capacitor 314 is coupled to the reset PMOS 313, the charge integrator capacitor 314 will be discharged to VDD 315 responsive to a high reset signal 311 activating the reset PMOS 313.

A low reset signal 311 begins a detection interval of a phase distance between a first phase 112 and a second phase 114 over multiple clock periods. In some embodiments, a user of the multiphase system may drive (e.g., via a finite state machine (FSM)) reset signal 311. The inverter 312 receives the low reset signal 311 as input and inverts the reset signal 311 such that the output of the inverter 312 is a logic high signal. Responsive to receiving a logic high signal from inverter 312, reset PMOS 313 is deactivated. Responsive to the PMOS 313 being deactivated, pulses of current (Igated) flow into the charge integrator capacitor 314, thereby charging the charge integrator capacitor 314 and decreasing VOUT 321. Igated is a current pulse that pulses for $\frac{3}{8}^{th}$ of a clock period (as described above), so, the rate at which VOUT 321 decreases may be expressed in the following equation, where c represents a phase distance error, I represents current from current source 340, and C represents capacitance of charge integrator capacitor 314:

$$\frac{dv}{dt} = -\left(\frac{3}{8} + \varepsilon\right) * \frac{I}{C} \quad (9)$$

It can be noted that the above equation (5) is specific to embodiments with eight clock phases. As explained above, aspects the present disclosure may be applied to any number of clock phases. Accordingly, the rate at which VOUT 321 decreases may be expressed in the following general equation, where N represents a number of clock phases generated by multiphase clock generator 106:

$$\frac{dv}{dt} = -\left(\frac{\left(\frac{N}{2}\right)-1}{N} + \varepsilon\right) * \frac{I}{C} \quad (10)$$

As illustrated with respect to equation (9), the rate at which VOUT decreases as charge integrator capacitor 314 charges is constrained by a pulse length of Igated (e.g., $\frac{3}{8}^{th}$ of a clock period) and a phase distance error (e.g., ε). Igated is equivalent to a phase distance between a first phase and a second phase, as described with respect to FIG. 5A. Thus, equation (9) relates VOUT 321 to the phase distance between a first phase 112 and a second phase 114. Time-to-time converter 300 may measure an aggregate phase distance between the first phase 112 and the second phase 114 over multiple clock periods by coupling a comparator 320 between the charge integrator 310 and the current gate 330. The comparator 320 is configured to end a detection interval responsive to VOUT 321 reaching a threshold voltage. In some embodiments, a developer of the time-to-time converter 300 may set the threshold. For example, a developer may configure the comparator 320 such that the threshold voltage is VDD/2, as illustrated below with respect to FIG. 5B. In some embodiments, the comparator 320 may include an inverter 322, where VOUT 321 is an input of inverter 322 and end of calibration signal 324 (referred generally as EOC signal 324 herein) is an inverted output of inverter 322. In some embodiments, inverter 322 is a MOS (e.g., PMOS, NMOS) inverter. In some embodiments, inverter 322 may be configured to have a threshold voltage value of VDD/2. Inverter 322 sets EOC signal 324 to low when VOUT is greater than VDD/2 and sets EOC signal to high when VOUT is less than VDD/2. Accordingly, the detection interval ends when VOUT 321 falls below a threshold voltage level VDD/2, thereby causing inverter 322 to drive EOC signal 324 to high. The comparator 320 is coupled to send EOC signal 324 to a time-to-digital converter (e.g., time-to digital converter 420, described with respect to FIG. 4). It is appreciated that the comparator 320 may be implemented by another circuit with a different threshold voltage, such as a comparator that compares VOUT against a desired input voltage to determine whether EOC signal 324 goes logic high or logic low, without deviating from the scope of the present disclosure.

Figure 4:
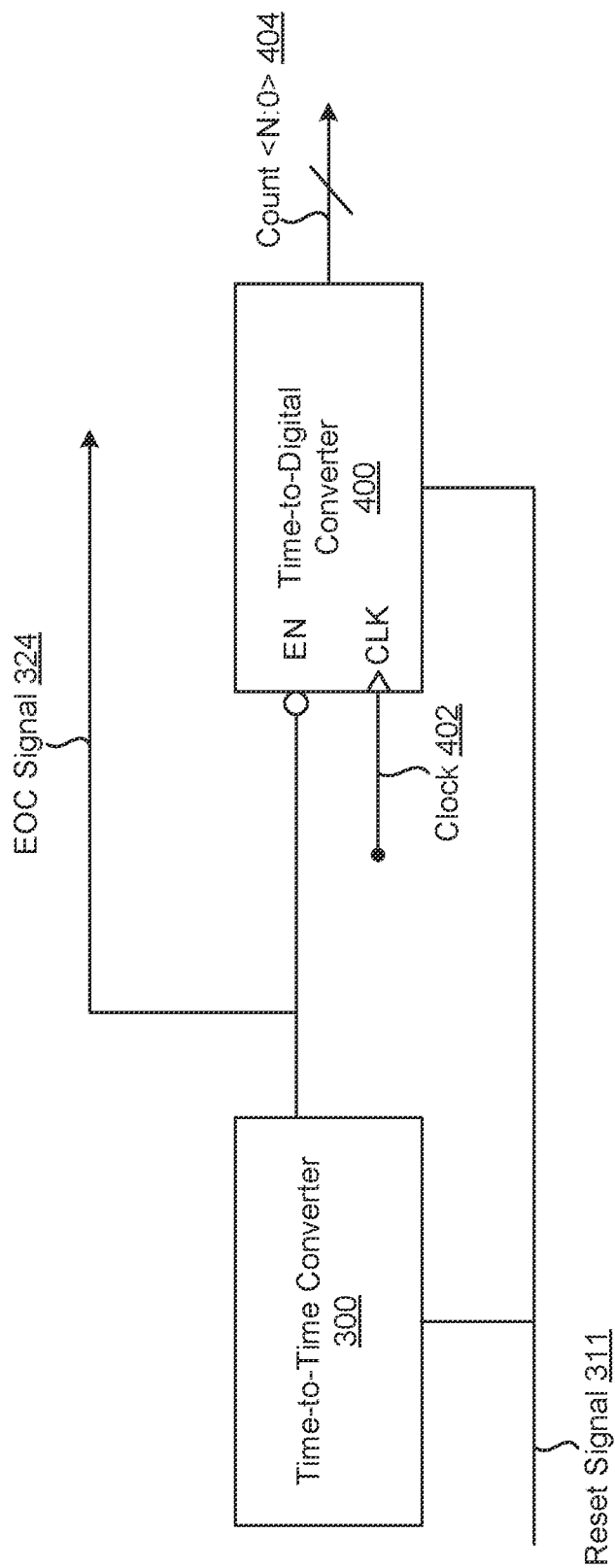
FIG. 4 is a circuit diagram of a time-to-digital converter coupled to a time-to-time converter, in accordance with some embodiments of the present disclosure.

FIG. 4 is a circuit diagram of a time-to-digital converter 400 (also referred to as time-to-digital converter circuit 400 or counter 400 herein) coupled to a time-to-time converter (e.g., time-to-time converter 300, described with respect to FIG. 3), in accordance with some embodiments of the present disclosure. In some embodiments, the time-to-digital converter 400 is a counter circuit configured to determine an aggregate time duration between a first phase (e.g., first phase 112) and a second phase (e.g., second phase 114) of a multiphase system. Counter 400 starts counting at the beginning of a detection interval of a phase distance between the first phase 112 and the second phase 114. A low reset signal 311 begins the detection interval, as described with respect to FIG. 3. Counter 400 is coupled to receive reset signal 311. Responsive to receiving a low reset signal 311 (e.g., via a user input), counter 400 resets a count 404 to zero and the detection interval begins. Once the detection interval begins, counter 400 begins incrementing count 404 according to a clock 402. Clock 402 drives a clock signal to counter 400. Upon each qualified clock edge (e.g., a rising edge, a falling edge) of clock 402, counter 400 increments count 404. In some embodiments, clock 402 may be a clock phase signal from a set of multiphase clock signals (e.g., multiphase signals 108). For example, clock 402 may be one of phase0 through phase7 of the multiphase system described with respect to FIG. 2. In some embodiments, clock 402 may be a master clock signal (e.g., single-phase clock signal 104) of a multiphase system (e.g., multiphase system 100).

Counter 400 is additionally coupled to receive EOC signal 324 from time-to-time converter 300. Time-to-time converter 300 drives EOC signal 324 to high at the end of a detection interval, as described above with respect to FIG. 3. Responsive to receiving a high EOC signal 324 from time-to-time converter 300, counter 400 ceases incrementing count 404. Accordingly, counter 400 begins incrementing count 404 when it receives a low reset signal 311 (signifying the beginning of a detection interval) and ceases incrementing count 404 when time-to-time converter 300 drives EOC signal 324 to high (signifying the end of the detection interval). Count 404, therefore, represents a time duration of a detection interval of a phase distance between a first phase and a second phase of a multiphase clock system. In some embodiments, the detection interval occurs over multiple clock periods. As such, count 404 represents an aggregated time duration between a first clock phase and second clock phase over multiple clock periods. Because the detection interval occurs over multiple clock periods, counter 400 amplifies any phase mismatch present between the first phase and the second phase. In some embodiments, the aggregate time duration may be stored in a memory (not illustrated) for later retrieval and analysis.

The aggregate time duration may be compared to a target time duration over a number of clock periods corresponding to the detection interval to determine a phase mismatch between the first phase and second phase. The target time duration represents a time duration between the first phase and second phase in a uniform multiphase system. In some embodiments, combination logic (not illustrated) may be coupled to receive the aggregate time duration from time-to-time converter and compare the aggregate time duration to the target time duration. The difference between the aggregate time duration and the target time duration indicates a phase mismatch between the first phase and the second phase. A multiphase clock generator (e.g., multiphase clock generator 106) may be adjusted (e.g., via a delay line) based on the phase mismatch between the first phase and second phase to modify the propagation delay of the first phase and second phase to correct the phase mismatch. In some embodiments, the combination logic may adjust the multiphase clock generator based on the phase mismatch. In some embodiments, the combination logic may be a finite state machine (FSM). In one example, it may be determined that the aggregate time duration between the first phase and second phase over 10 clock periods is 100 femtoseconds lesser than the target time duration over 10 clock periods. Accordingly, the phase mismatch between the first phase and second phase over one clock period is 10 femtoseconds. Responsive to determining the phase mismatch between the first phase and second phase over one clock period is 10 femtoseconds, codes may be driven to a delay line (e.g., via a programmable delay line) to modify the propagation delay of the first phase or the second phase to correct the 10 femtoseconds phase mismatch.

In some embodiments, the target time duration may be determined based on the average time duration between each adjacent clock phase of the multiphase system. For example, in an eight-phase system, the target time duration may be determined by averaging the time duration between phase0 and phase1, phase1 and phase2, phase2 and phase3, phase3 and phase4, phase4 and phase5, phase5 and phase6, phase6 and phase7, and phase7 and phase0.

In some embodiments, the target time duration between each adjacent clock phase may be determined using the systems and methods described herein. For example, clock phase selector (e.g., clock phase selector 110), a time-to-time converter (e.g., time-to-time converter 116), and a time-to-digital converter (e.g., time-to-digital converter 118) may determine an aggregate time duration for each adjacent clock phase of a multiphase clock generator (e.g., multiphase clock generator 106). The target time duration may be determined using the average aggregate time duration of the adjacent clock phases. Because the same circuitry is used to measure phase distance between each adjacent phase and determine the target time duration, any gain error present in circuitry described herein may be mitigated to not affect the accuracy of phase mismatch detection systems and techniques described herein. Gain error may occur due to temperature, process variations, voltage fluctuation, etc. For example, process variations may occur in a component (e.g., charge integrator capacitor 314) of a circuit due to imperceptible difference created during fabrication. Process variation generally refers to the difference between the actual quality of the component and intended quality of the component. For example, the actual capacitance of charge integrator capacitor 314 of FIG. 3 may be different than the intended or expected capacitance of charge integrator capacitor 314, thereby causing gain error in the circuit. However, any gain error present in the multiphase system may be negated as the same circuitry is used to measure phase distance and aggregate time duration for each adjacent phase of the multiphase system.

In some embodiments, the functionality of time-to-digital converter 400 may be achieved using a timer and an analog-to-digital converter (ADC) (not illustrated). The timer may begin counting at the beginning of a detection interval (e.g., responsive to deactivating reset transistor 312) and stop counting after a predefined amount of time (e.g., 1,000 femtoseconds). When the time stops counting, the ADC may converter integrator voltage (e.g., VOUT 321) to a digital value. The digital value represents a result of the detection interval. It is appreciated that the ADC may be any ADC (e.g., a successive-approximation ADC, a flash ADC, etc.).

Figure 5B:
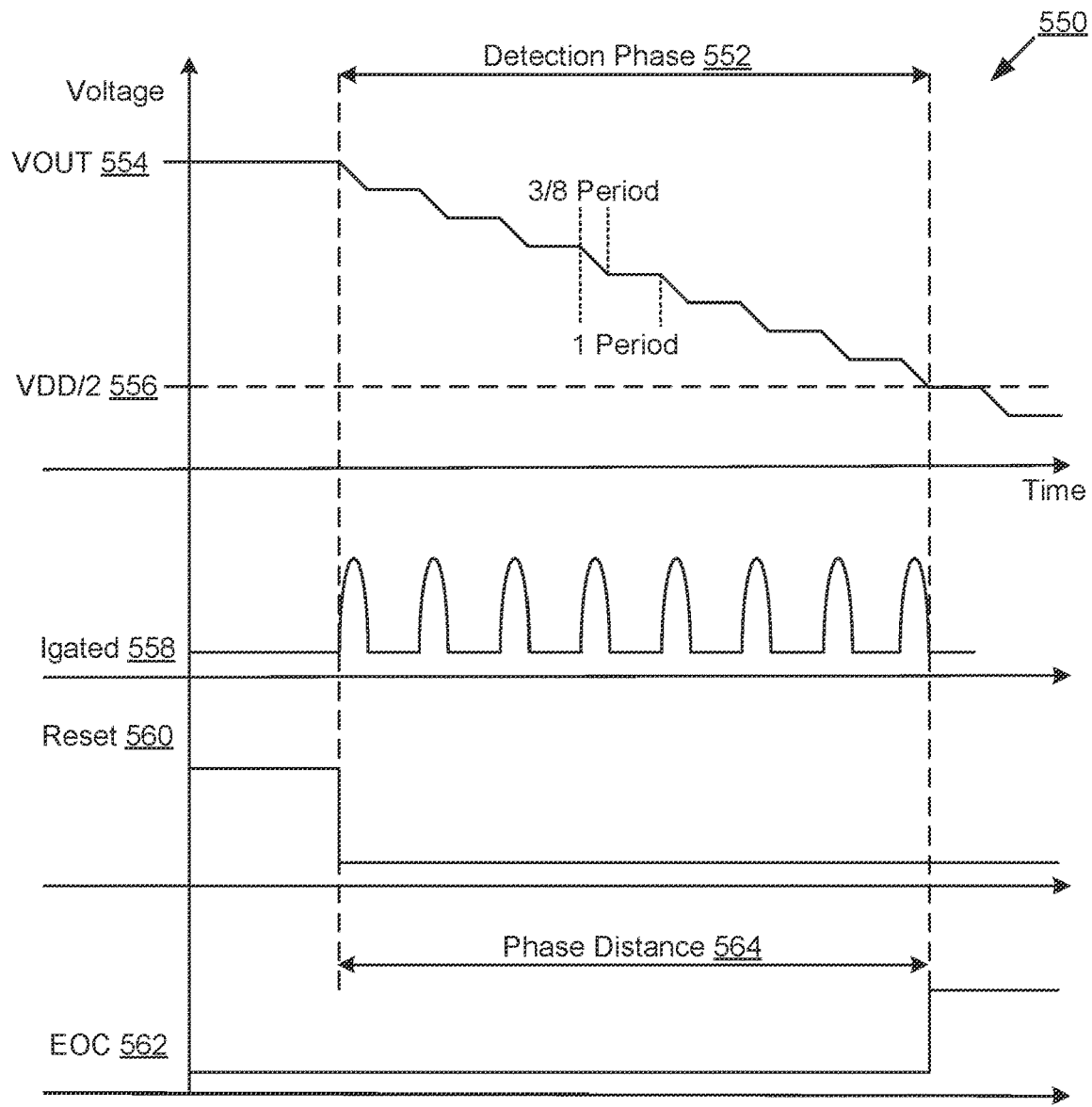
FIG. 5B is a timing diagram illustrating measuring a phase distance between a falling edge of a first clock phase and a rising edge of a second phase clock, in accordance with some embodiments of the present disclosure.

FIG. 5B is a timing diagram 550 of signals of a time-to-time converter and a time-to-digital converter, in accordance with some embodiments of the present disclosure. The time-to-time converter and the time-to-digital converter correspond to a multiphase clock generator (e.g., multiphase clock generator 106 of FIG. 1) with eight clock phases. In some embodiments, the time-to-time converter corresponds to time-to-time converter 116 of FIG. 1 or time-to-time converter 300 of FIG. 3. In some embodiments, the time-to-digital converter may correspond to time-to-digital converter 118 of FIG. 1 or time-to-digital converter 400 of FIG. 4.

Reset signal 560 marks the beginning of a detection interval 552 for detecting a phase distance 564 between a first phase and a second phase of an eight-phase system. As illustrated with respect to FIG. 5B, detection interval 552 occurs over multiple clock periods of the eight-phase system. Responsive to receiving a low reset signal 560, Igated 558 begins charging a charge integrator capacitor (e.g., charge integrator capacitor 314) of the time-to-time converter, and a corresponding output voltage (VOUT 554) of the time-to-time converter begins falling. Additionally, time-to-digital converter begins counting. The slope of VOUT may be modeled by equation (9), as described above with respect to FIG. 3. Igated 558 is gated by a current gate (e.g., current gate 330 of FIG. 3) and, therefore, charges the charge integrator capacitor for $\sfrac{3}{8}^{th}$ of the clock period. Accordingly, VOUT 554 decreases for $\sfrac{3}{8}^{th}$ of each clock period and remains constant for $\sfrac{5}{8}^{th}$ of each clock period. The $\sfrac{3}{8}^{th}$ clock period corresponds to the distance between the rising edge of the second phase and the falling edge of the first phase, as described with respect to FIG. 5A. The detection interval 552 ends responsive to VOUT 554 falling below a threshold voltage (VDD/2 556). Responsive to VOUT 544 falling below VDD/2 556, the time-to-time converter drives an end of calibration signal (EOC 562) to high and the time-to-digital converter stops counting.

FIG. 6A through FIG. 6F illustrate alternative circuit diagrams of a current gate, in accordance with some embodiments of the present disclosure.

FIG. 6A illustrates current gate 600, an alternative configuration of current gate 330. Phase distance 605 is measured between a falling edge of clk0 and a rising edge of clk1. Current gate 600 is configured to allow current to flow through current gate 600 during phase distance 605. Current gate 600 includes an NMOS transistor 601 and an NMOS transistor 602 coupled in series. NMOS transistor 601 is coupled to receive clk1 and NMOS transistor 602 is coupled to receive clk0.

FIG. 6B illustrates current gate 610, an alternative configuration of current gate 330. Phase distance 615 is measured between a falling edge of clk0 and a rising edge of clk1. Current gate 610 is configured to allow current to flow through current gate 610 during phase distance 615. Current gate 610 includes a PMOS transistor 611 coupled in series to an NMOS transistor 612. PMOS transistor 611 is coupled to receive clk1 and NMOS transistor 612 is coupled to receive clk0.

FIG. 6C illustrates current gate 620, an alternative configuration of current gate 330. Phase distance 625 is measured between a falling edge of clk0 and a falling edge of clk1, as illustrated. Current gate 620 is configured to allow current to flow through current gate 620 during phase distance 625. Current gate 620 includes an NMOS transistor 621 coupled in series to a PMOS transistor 622. NMOS transistor 621 is coupled to receive clk1 and PMOS transistor 622 is coupled to receive clk0.

FIG. 6D illustrates current gate 630, an alternative configuration of current gate 330. Phase distance 635 is measured between a falling edge of clk1 and a rising edge of clk0. Current gate 630 is configured to allow current to flow through current gate 630 during phase distance 635. Current gate 630 includes a PMOS transistor 631 coupled in series to a PMOS transistor 632. PMOS transistor 631 is coupled to receive clk1 and PMOS transistor is coupled to receive clk0.

FIG. 6E illustrates current gate 640, an alternative configuration of current gate 330. Phase distance 645 is measured between a rising edge of clk0 and a falling edge of clk1. Current gate 640 is configured to allow current to flow through current gate 640 during phase distance 645. Current gate 640 includes an NMOS transistor 641 coupled in parallel to an NMOS transistor 642. NMOS transistor 641 is coupled to receive clk1 and NMOS transistor 642 is coupled to receive clk0.

FIG. 6F illustrates current gate 650, an alternative configuration of current gate 330. Phase distance 655 is measured between a falling edge of clk0 and a rising edge of clk1. Current gate 650 is configured to allow current to flow through current gate 650 during phase distance 655. Current gate 650 includes a PMOS transistor 651 coupled in parallel to a PMOS transistor 652. PMOS transistor 651 is coupled to receive clk1 and PMOS transistor 652 is coupled to receive clk0.

FIG. 7A through FIG. 7D illustrate alternative circuit diagrams of a time-to-time converter 300, in accordance with some embodiments of the present disclosure.

FIG. 7A illustrates an alternative configuration of time-to-time converter 300. Time-to-time converter 700 includes a reset PMOS 704 coupled to receive reset signal 702 through an inverter, where reset signal 702 is active high. A charge integrator capacitor 703 is in turn coupled to reset PMOS 704. A current gate is coupled between the charge integrator capacitor 703 and a current source 710. The current gate includes a first NMOS 706 and a second NMOS 708. Current source 710 is coupled between the current gate and ground.

FIG. 7B illustrates an alternative configuration of time-to-time converter 300. Time-to-time converter 720 includes a reset PMOS 724 coupled to receive reset signal 722 through an inverter, where reset signal 722 is active high. A charge integrator capacitor 723 is in turn coupled to reset PMOS 724. A current source 726 is coupled between charge integrator capacitor 723 and a current gate. The current gate includes a first NMOS 728 and a second NMOS 730. The current gate is coupled between current source 726 and ground.

FIG. 7C illustrates an alternative configuration of time-to-time converter 300. Time-to-time converter 740 includes a current source 742 coupled between a supply voltage (VDD) and a current gate. The current gate includes a first PMOS 744 and a second PMOS 746. Time-to-time converter 740 further includes a charge integrator capacitor 750 and a reset NMOS 752 coupled between the current gate and ground. NMOS 752 is coupled to receive reset signal 748, where reset signal 748 is active high.

FIG. 7D illustrates an alternative configuration of time-to-time converter 300. Time-to-time converter 760 includes a current gate coupled between a supply voltage (VDD) and a current source 766. The current gate includes a first PMOS 762 and a second PMOS 764. Time-to-time converter 760 further includes a charge integrator capacitor 768 and a reset NMOS 770 coupled between the current gate and ground. NMOS 770 is coupled to receive reset signal 772, where reset signal 772 is active high. It is appreciated that reset signals 702, 722, 748, and 772 may be active low by inserting or removing inverters along its path, without deviating from the scope of the present disclosure.

Figure 8:
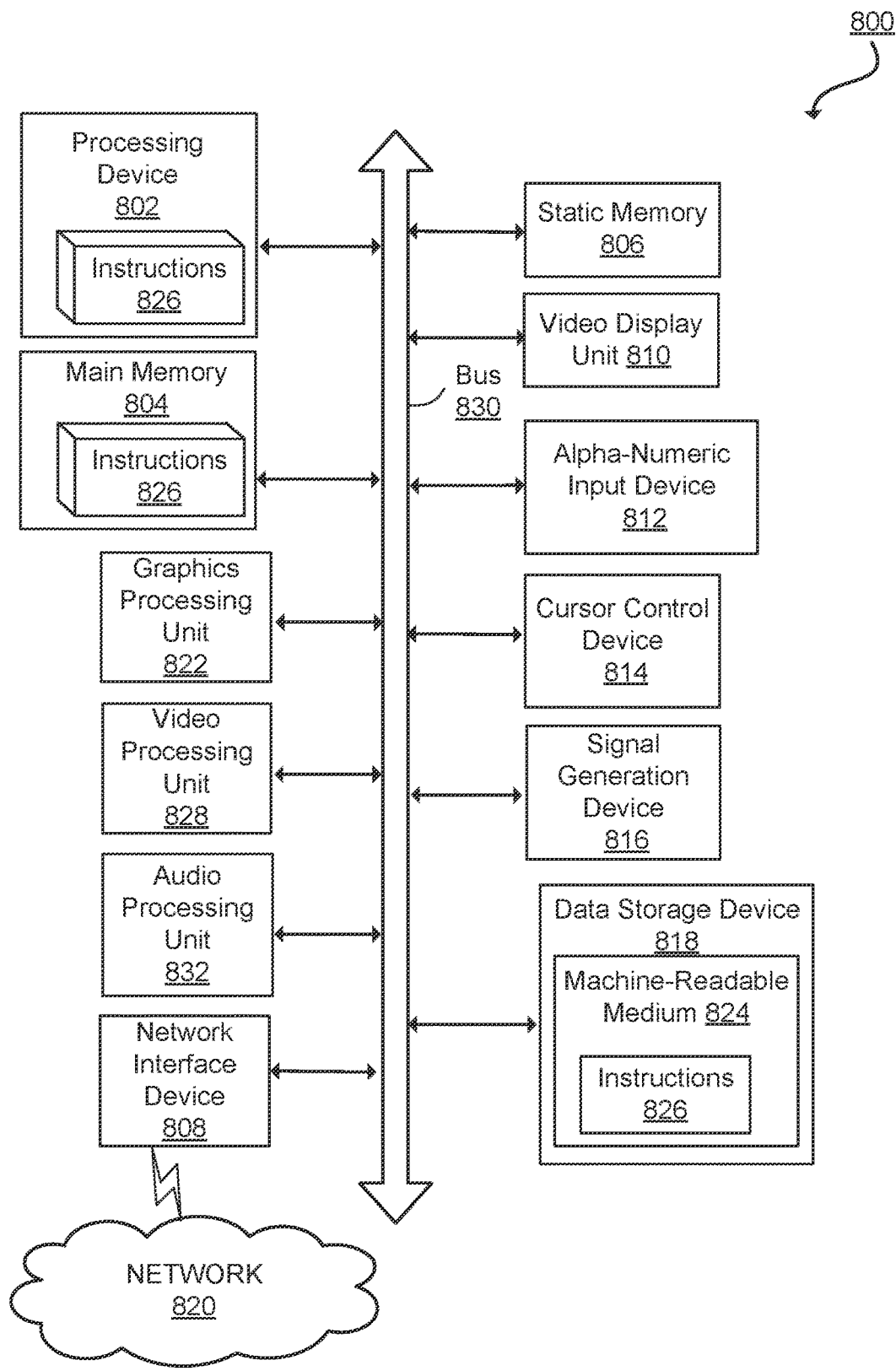
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine, allowing the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform a similar sequence of procedures. In addition, the present disclosure is not described with reference to any particular programming language and any one in use in such computer systems may be used to implement the teachings of the disclosure as described herein.

The present disclosure may be provided as a computer program product, or software, that may include a non-transitory computer-readable storage medium (CRM) having stored thereon instructions, which may be used to program a computer system (or other electronic devices) to perform a process according to the present disclosure. A CRM includes any mechanism for storing information in a form readable by a machine (e.g., a computer). For example, a CRM includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element may be depicted in the figures and like elements are labeled with like numerals. The disclosure and drawings are, accordingly, to be regarded in an illustrative sense rather than a restrictive sense.

What is claimed is:

1. A method of detecting phase mismatch of a multiphase clock system, the method comprising:
    identifying a plurality of clock phases of the multiphase clock system;
    selecting a first clock phase and a second clock phase of the plurality of clock phases of the multiphase clock system;
    determining an aggregate phase distance between the first clock phase and the second clock phase over a plurality of clock periods of the multiphase clock system;
    determining, based on the aggregate phase distance, an aggregate time duration between the first clock phase and the second clock phase over the plurality of clock periods of the multiphase clock system; and
    determining a phase mismatch between the first clock phase and the second clock phase based on the aggregate time duration.

2. The method of claim 1, further comprising:
    identifying a target time duration between the first clock phase and the second clock phase;
    comparing the aggregate time duration between the first clock phase and the second clock phase to the target time duration between the first clock phase and the second clock phase to determine the phase mismatch between the first clock phase and the second clock phase; and
    adjusting the multiphase clock system based on the phase mismatch between the first clock phase and the second clock phase.

3. The method of claim 2, wherein identifying the target time duration between the first clock phase and the second clock phase comprises determining an average time duration between adjacent clock phases of the plurality of clock phases of the multiphase clock system.

4. The method of claim 1, wherein the first clock phase and the second clock phase are adjacent clock phases of the plurality of clock phases of the multiphase clock system.

5. The method of claim 1, wherein determining the aggregate phase distance between the first clock phase and the second clock phase over the plurality of clock periods of the multiphase clock system comprises:
    responsive to activating a reset transistor coupled to a charge integrator capacitor, discharging the charge integrator capacitor;
    deactivating the reset transistor to indicate a beginning of a detection interval of the aggregate phase distance between the first clock phase and the second clock phase;
    responsive to deactivating the reset transistor, charging the charge integrator capacitor using a current source; and
    responsive to the charge integrator capacitor falling below a threshold voltage, ending the detection interval.

6. The method of claim 5, wherein determining, based on the aggregate phase distance, the aggregate time duration between the first clock phase and the second clock phase over the plurality of clock periods of the multiphase clock system:
    responsive to deactivating the reset transistor, incrementing a count of a counter circuit; and
    responsive to the charge integrator capacitor falling below the threshold voltage, ceasing to increment the count of the counter circuit, the count of the counter circuit when the charge integrator capacitor falls below the threshold voltage corresponding to the aggregate time duration between the first clock phase and the second clock phase over the plurality of clock periods of the multiphase clock system.

7. The method of claim 6, wherein the plurality of clock periods of the multiphase clock system corresponds to a clock period of a clock phase from the plurality of clock phases of the multiphase clock system.

8. The method of claim 1, wherein selecting the first clock phase and the second clock phase of the multiphase clock system comprises selecting the first clock phase and the second clock phase of the multiphase clock system using a multiplexer (MUX).

9. An integrated circuit comprising:
a time-to-time converter circuit to receive a first clock phase and a second clock phase of a plurality of clock phases and determine an aggregate phase distance between the first clock phase and the second clock phase over a plurality of clock periods of a multiphase clock system; and
a time-to-digital converter circuit coupled to the time-to-time converter circuit, the time-to-digital converter circuit to determine an aggregate time duration between the first clock phase and the second clock phase based on the aggregate phase distance.

10. The integrated circuit of claim 9, further comprising:
a multiphase clock generator to receive a single-phase clock from a clock source and to generate the plurality of clock phases using the single-phase clock;
a phase selection circuit coupled to the multiphase clock generator, the phase selection circuit to select the first clock phase and the second clock phase of the plurality of clock phases; and
combination logic coupled to the time-to-time converter circuit, the combination logic to compare the aggregate time duration between the first clock phase and the second clock phase to a target time duration between the first clock phase and the second clock phase to determine a phase mismatch between the first clock phase and the second clock phase and adjust the multiphase clock generator based on the phase mismatch.

11. The integrated circuit of claim 10, wherein the time-to-time converter circuit comprises:
a current gate comprising:
a first transistor to receive the first clock phase, wherein the first transistor allows a current to flow from a current source through the time-to-time converter when the first clock phase is at a logic high signal;
a second transistor to receive the second clock phase, wherein the first transistor allows current to flow from the current source through the time-to-time converter when the second clock phase is at a logic high signal;
a charge integrator capacitor to receive current through the current gate at a beginning of a detection interval of the aggregate phase distance between the first clock phase and the second clock phase; and
an inverter coupled between the current gate and the charge integrator capacitor, the inverter to end the detection interval responsive to the charge integrator capacitor falling below a threshold voltage.

12. The integrated circuit of claim 11, wherein the time-to-digital converter circuit comprises a counter circuit to start incrementing a count of the counter circuit at the beginning of the detection interval and to stop incrementing the count of the counter circuit at the end of the detection interval, wherein the count represents the aggregate time duration between the first clock phase and the second clock phase over the plurality of clock periods.

13. The integrated circuit of claim 10, wherein the phase selection circuit comprises one or more multiplexers.

14. A non-transitory computer-readable storage medium storing instructions which, when executed, cause a processing device to perform operations comprising:
identifying a plurality of clock phases of a multiphase clock system;
selecting a first clock phase and a second clock phase of the plurality of clock phases of the multiphase clock system;
determining an aggregate phase distance between the first clock phase and the second clock phase over a plurality of clock periods of the multiphase clock system; and
determining, based on the aggregate phase distance, an aggregate time duration between the first clock phase and the second clock phase over the plurality of clock periods of the multiphase clock system; and
determining, based on the aggregate time duration, a phase mismatch between the first clock phase and the second clock phase.

15. The non-transitory computer-readable storage medium of claim 14, further comprising:
identifying a target time duration between the first clock phase and the second clock phase;
comparing the aggregate time duration between the first clock phase and the second clock phase to the target time duration between the first clock phase and the second clock phase to determine the phase mismatch between the first clock phase and the second clock phase; and
adjusting the multiphase clock system based on the phase mismatch between the first clock phase and the second clock phase.

16. The non-transitory computer-readable storage medium of claim 15, wherein identifying the target time duration between the first clock phase and the second clock phase comprises determining an average time duration between adjacent clock phases of the plurality of clock phases of the multiphase clock system.

17. The non-transitory computer-readable storage medium of claim 14, wherein the first clock phase and the second clock phase are adjacent clock phases of the plurality of clock phases of the multiphase clock system.

18. The non-transitory computer-readable storage medium of claim 14, wherein determining the aggregate phase distance between the first clock phase and the second clock phase over the plurality of clock periods of the multiphase clock system comprises:
responsive to activating a reset transistor coupled to a charge integrator capacitor, discharging the charge integrator capacitor;
deactivating the reset transistor to indicate a beginning of a detection interval of the aggregate phase distance between the first clock phase and the second clock phase;
responsive to deactivating the reset transistor, charging the charge integrator capacitor using a current source; and
responsive to the charge integrator capacitor falling below a threshold voltage, ending the detection interval.

19. The non-transitory computer-readable storage medium of claim 18, wherein determining, based on the aggregate phase distance, the aggregate time duration between the first clock phase and the second clock phase over the plurality of clock periods of the multiphase clock system:
- responsive to deactivating the reset transistor, incrementing a count of a counter circuit; and
- responsive to the charge integrator capacitor falling below the threshold voltage, ceasing to increment the count of the counter circuit, the count of the counter circuit when the charge integrator capacitor falls below the threshold voltage corresponding to the aggregate time duration between the first clock phase and the second clock phase over the plurality of clock periods of the multiphase clock system.

20. The non-transitory computer-readable storage medium of claim 19, wherein the plurality of clock periods of the multiphase clock system corresponds to a clock period of a clock phase from the plurality of clock phases of the multiphase clock system.

\* \* \* \* \*